(12) United States Patent
Yazaki et al.

(10) Patent No.: US 7,723,135 B2
(45) Date of Patent: May 25, 2010

(54) MANUFACTURING METHOD OF DISPLAY DEVICE

(75) Inventors: Akio Yazaki, Yokohama (JP); Mikio Hongo, Yokohama (JP); Takeshi Sato, Kokubunji (JP); Takahiro Kamo, Tokyo (JP)

(73) Assignee: Hitachi Displays, Ltd., Mobara-shi (JP)

( * ) Notice: Subject to any disclaimer, the term of this patent is extended or adjusted under 35 U.S.C. 154(b) by 0 days.

(21) Appl. No.: 12/022,201

(22) Filed: Jan. 30, 2008

(65) Prior Publication Data

US 2008/0188012 A1 Aug. 7, 2008

(30) Foreign Application Priority Data

Jan. 31, 2007 (JP) ............................... 2007-020446

(51) Int. Cl.
*H01L 21/00* (2006.01)

(52) U.S. Cl. .............................. 438/30; 438/22; 438/48; 438/60; 257/E21.53; 257/E21.413

(58) Field of Classification Search ................... 438/30, 438/487, 622, 795, 796, 798, 799; 257/E21.53, 257/E21.413
See application file for complete search history.

(56) References Cited

U.S. PATENT DOCUMENTS

| 6,341,042 B1 | 1/2002 | Matsunaka et al. |
| 6,943,086 B2 | 9/2005 | Hongo et al. |
| 2004/0065736 A1* | 4/2004 | Tsikos et al. ................ 235/454 |
| 2007/0172685 A1* | 7/2007 | Kapur et al. ................ 428/523 |
| 2008/0198334 A1* | 8/2008 | Kasazumi et al. ............. 353/38 |

FOREIGN PATENT DOCUMENTS

| JP | 11-283933 | 10/1999 |
| JP | 2000-133614 | 5/2000 |
| JP | 2001-102323 | 4/2001 |
| JP | 2003-124136 | 4/2003 |

* cited by examiner

*Primary Examiner*—Alexander G Ghyka
*Assistant Examiner*—Abdulfattah Mustapha
(74) *Attorney, Agent, or Firm*—Antonelli, Terry, Stout & Kraus, LLP.

(57) ABSTRACT

In crystallization of a silicon film by annealing with a linear-shaped laser beam having an ununiform width of the short axis of the beam, the profile (intensity distribution) of the laser beam is evaluated, and the result is fed back to an oscillating condition of the laser beam or an optical condition which projects this onto the silicon film, whereby a display device comprising a high-quality crystalline silicon film is produced. In the present invention, (1) the energy distribution of the linear-shaped laser beam is measured by a detector type CCD camera moved stepwise in the directions that its long axis and short axis extend, respectively, (2) a value obtained by dividing an accumulated intensity E in the long axis direction obtained by accumulating the detected signals in a direction parallel to the short axis by the square root of the width W of the short axis of the linear-shaped laser beam in each position in the long axis: $E/\sqrt{W}$, is determined in all the positions of a cross section of the linear-shaped laser beam. Since a laser power which is suitable for lateral crystal growth of the silicon film has a close correlation with $E/\sqrt{W}$, this value is used as an evaluation result mentioned above in the present invention.

11 Claims, 11 Drawing Sheets

Lens Focal Point

CCD Signal Intensity (Relative Value)

Short Axis Direction of Beam

Long Axis Direction of Beam

Peak Intensity of the Beam: P

Accumulated Intensity: E

Gaussian (Distribution)

$$y = P \times \exp\left(\frac{-8 x^2}{W^2}\right)$$

$1/e^2$ Total Width of the Beam: W

※ [Accumulated Intensity: E] = $K_1$ × [Peak Intensity: P] × [Beam Width: W]

MANUFACTURING METHOD OF DISPLAY DEVICE

The present application claims priority from Japanese application JP2007-020446 filed on Jan. 31, 2007, the content of which is hereby incorporated by reference into this application.

BACKGROUND OF THE INVENTION

1. Field of the Invention

The present invention relates to a display panel, and particularly to a manufacturing method for forming active elements formed on an insulating substrate constituting the display panel.

The present invention is suitable for manufacturing a display device using an insulating substrate with active elements formed in a strip-shaped poly-crystalline semiconductor film, obtained by reforming an amorphous or granular poly-crystalline semiconductor film formed on one of the main surfaces of the insulating substrate constituting the display device so as to expand crystal grains into a substantially strip-like shape by irradiating the film with laser light (also referred to as laser beam).

2. Description of the Related Art

In current display devices, which are so-called display panels and flat displays such as liquid crystal and organic electroluminescence display units, an image is formed by switching active elements (thin film transistor: TFT) of a plurality of pixel circuits consisting of an amorphous or poly-crystalline silicon film on a substrate of glass, fused quartz or the like with an insulating film interposed therebetween. A substrate on which pixel circuits are formed is referred to as an active matrix substrate, TFT substrate, or is simply referred to as an active panel or a substrate.

If peripheral circuit (hereinafter also referred to as pixel driver circuits and the like or simply as driver circuits) including a pixel driver circuit for driving pixel circuits can be simultaneously formed on such a substrate, a dramatic reduction in production costs and improvement in reliability are expected. However, when an amorphous silicon is used as a silicon semiconductor film (hereinafter also referred to as silicon thin film or silicon film) constituting an active layer of a thin film transistor constituting a pixel driver circuit and the like, the performance of the thin film transistor, of which typical example is mobility, is low. Thus, it is difficult to manufacture a pixel driver circuit and the like, for which high speed and high function are required, from an amorphous silicon.

In order to manufacture such a high-speed and high-function pixel driver circuit and the like, a high-mobility thin film transistor is required. To realize the high-mobility thin film transistor, it is necessary to improve the crystallinity of the silicon thin film. As a method for improving the crystallinity, excimer laser annealing has been getting a lot of attention. According to this excimer laser annealing (ELA) method, mobility is improved by irradiating an amorphous silicon film formed on an insulating substrate of glass or the like with an insulating film interposed therebetween with excimer laser so that the amorphous silicon film is transformed into a granular poly-crystalline silicon film.

However, in the granular poly-crystalline silicon film obtained by the ELA method, the grain size is about several tens to hundreds of nanometers. Thus, the granular poly-crystalline silicon film is deficient in performance to be applied to a pixel driver circuit or the like for driving a pixel transistor in a display device at a high speed.

As a solution to this problem, Patent document 1 discloses a method of forming so-called strip-like crystals in which a polysilicon portion is scanned and irradiated with a time-modulated continuous-wave laser beam (laser beam) condensed into a linear form (a rectangular form in which the width of the long axis is extremely greater than that of the short axis) at a high speed in the direction which crosses the longitudinal direction (long axis) of the linear form so that crystals are laterally grown in the scanning direction. According to this method, the entire surface of the substrate is polycrystallized by the excimer laser annealing, and then only a region where driver circuits are formed is scanned by the above-mentioned laser beam condensed into a linear form in the direction which coincides with the current path (drain-source direction) of the formed transistor so that crystal grains are grown in the scanning direction (lateral direction) in the form of strips. As a result, the mobility is greatly improved by the absence of crystal grain boundaries which traverse the current path or by reforming the crystal grains into minute strip-like crystalline silicon. This method is herein referred to as SELAX (Selectively Enlarging LAser X'tallization) method.

In the SELAX method, to obtain a uniform strip-shaped crystalline silicon film, the laser beam is shaped into a linear form whose intensity distribution along the above long axis of the laser beam has a flat top and width of the short axis is reduced to a few microns. At this time, the width of the short axis of the linear-shaped beam is ununiform in some cases due to the influences of the lens aberration of the laser optical system and the like. Since there have been no techniques for quantitatively evaluating the beam profiles of laser beams which can deal with this situation, a variation in the crystal quality occurs. This is one of the factors that limit an improvement in the yield of the products. To mitigate the variation in the crystal quality in the SELAX step and to mitigate a decrease in the yield of the products, it is necessary to establish a method of evaluating the beam profile of the laser beam which has a direct correlation with the quality of the crystalline film, and to control the beam profile of the laser beam based on the evaluation.

An example of the documents which disclose known techniques relating to evaluation of the beam profile of laser beam is Patent document 2. Patent document 2 discloses the ELA crystallization, in which the beam profile of the laser beam is controlled by calculating energy density by detecting a part of the laser power and a part of the width of the short axis of the beam profile of the laser beam all the time and feedback-controlling a transmittance adjusting mechanism so that the energy density is kept constant all the time.

[Patent Document 1]
Japanese Unexamined Patent Publication No. 2003-124136

[Patent Document 2]
Japanese Unexamined Patent Publication No. 2001-102323

SUMMARY OF THE INVENTION

The above-mentioned Patent document 1 does not disclose a quantitative beam profile evaluation method or a method of evaluating a linear-shaped beam having an ununiform short axis shape. Patent document 2 discloses a method of locally observing the beam profile of the linear-shaped laser beam to detect the width of the short axis, but it is based on the assumption that the width of the short axis is uniform throughout the entire laser beam, and does not mention or suggest a method of evaluating the beam profile of the laser beam having an ununiform width of the short axis and controlling the beam profile of the laser beam based on this evaluation.

An object of the present invention is to provide a manufacturing method of a display device using a high-quality crystalline silicon film obtained by evaluating the intensity distribution of the beam profile when a linear-shaped laser beam having an ununiform width of the short axis of the beam is applied to the SELAX and feeding this back to an irradiated laser beam.

The present invention (1) detects the energy distribution of the entire laser beam by moving an area detector type CCD camera or linear array sensor stepwise in the long axis direction of the linear-shaped laser beam or in the in the short axis direction; (2) accumulates detected signals (counter number) in a direction parallel to the short axis of the beam to calculate an accumulated intensity E in the long axis direction of the laser beam. This accumulated intensity E is divided by the square root of the width W of the short axis of the laser beam ($1/e^2$ of a Gaussian distribution, or a half-width) to calculate $E/\sqrt{(W)}$.

Subsequently, (3) in evaluating energy intensity distribution, a maximum value Max and a minimum value Min of the $E/\sqrt{(W)}$ intensity distribution in an evaluation target range is used for controlling the beam profile of the laser beam. Alternatively, a mean value Ave of the evaluation range is calculated, and the numerical value of (Max−Min)/Ave is used as a scale for controlling the beam profile of the laser beam.

(4) As another method than that mentioned in the above (2), $P \times \sqrt{(W)}$, which is the product of peak intensity distribution P in each position in the laser beam×the square root $\sqrt{(P \times E)}$ of the accumulated intensity distribution E, i.e., $\sqrt{(P \times E)}$ is used to carry out profile evaluation so that a similar result can be obtained.

The present invention is not limited to the constitution mentioned above or to the constitution disclosed in the best embodiment described later. Not to say, invention which are constituted without departing from the technical idea of the present invention are also included in the present invention.

Since the crystalline quality of the poly-crystalline film formed by the SELAX method can be quantitatively estimated from the measurement of the beam profile of the laser beam, high-quality crystals can be obtained, and the yield of the products can be improved. Since crystallinity can be assured with homogeneity at a level higher than a certain level in the crystallization step, it can effectively inhibit Vth fluctuation of a thin film transistor (TFT) resulting from crystallinity failure and a lowered yield of the panel in case it is applied to panel display device.

DETAILED DESCRIPTION

Specific embodiments of the present invention will be described below in detail with reference to the drawings of Examples.

EXAMPLE 1

Figure 1:
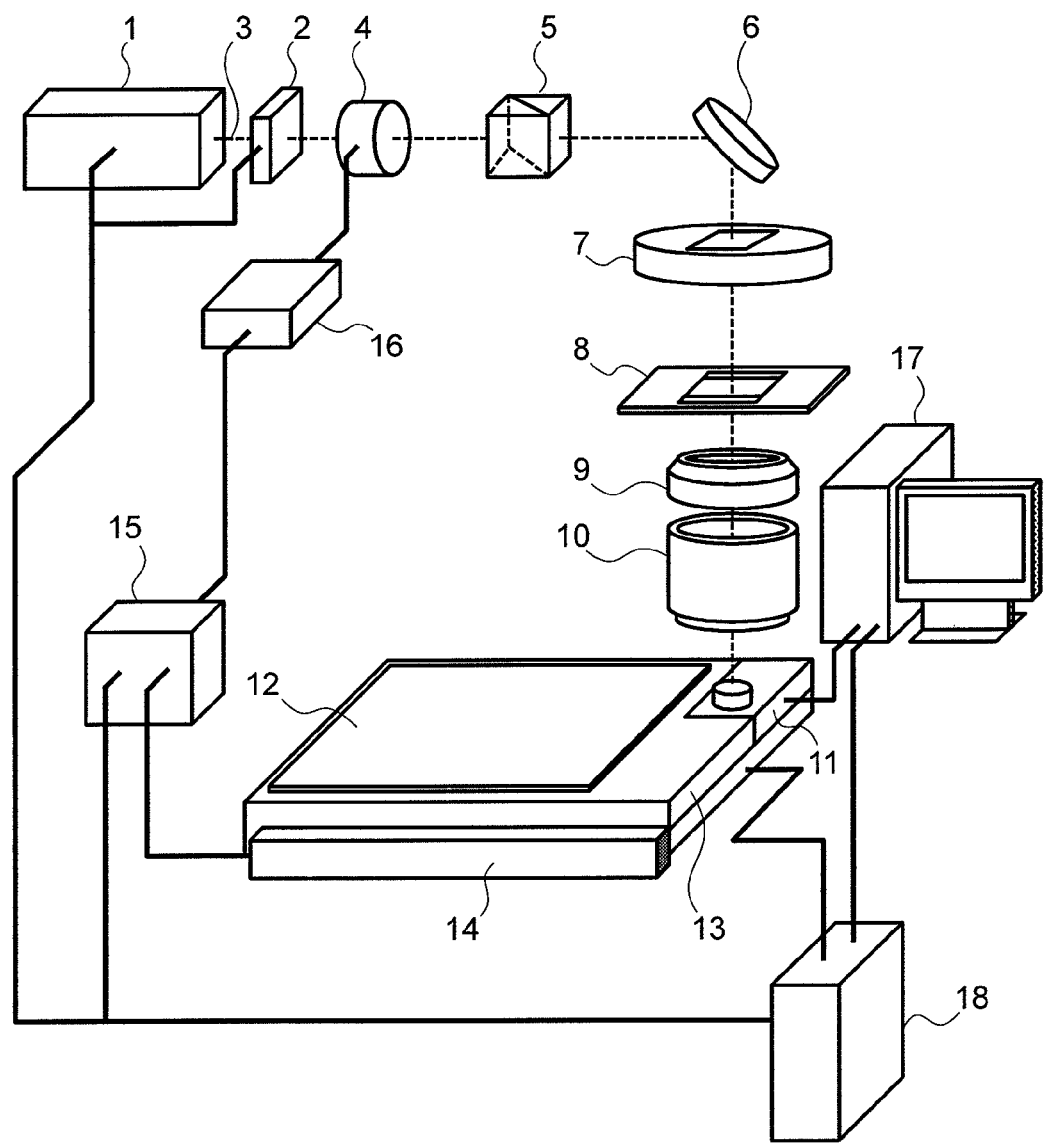
FIG. 1 is an explanatory view of a manufacturing device for carrying out the manufacturing method of display device of the present invention.

FIG. 1 is an explanatory view of a manufacturing device for carrying out the manufacturing method of the display device of the present invention. This manufacturing device is a laser annealing device employing the SELAX method which is suitable for reforming a silicon film of an active substrate constituting a display device, that is, an insulating substrate on which a thin film transistor is disposed, into high-quality strip-shaped crystalline silicon. The SELAX method is a process of irradiating a silicon film with a temporally modulated laser beam to improve its crystallinity.

The manufacturing device is constituted of an LD pumped continuous-wave solid-state laser used as a laser source 1, an attenuator 2 for adjusting the output of the continuous-wave laser beam 3 oscillated by this laser source 1, an EO modulator 4 and a polarizing beam splitter 5 for temporally modulating the continuous-wave laser beam 3, a reflecting mirror 6, a beam shaping optical element 7 which converts the laser beam into one having a desired intensity distribution, a slit 8 for cutting out the laser beam shaped by the shaping optical element 7 in a desired length, an imaging lens 9 for shrinking and projecting the laser beam, an objective lens 10, a CCD camera 11 for measuring the spatial intensity distribution of the shrunk and projected laser beam, a data processing unit 17 for processing the beam profile data detected by the CCD camera 11, a general control device (host computer) 18 which controls the entire device, a glass substrate 12 on which a silicon thin film is formed, a stage 13 on which the glass substrate 12 is mounted, a linear encoder (also referred to as linear scale) 14 for detecting the position of the stage 13, a control apparatus 15 which transfers a control signal to a driver 16 for counting pulse signals generated by the linear encoder 14 and driving the EO modulator 4 for every number of pulses which has been set in advance, and other components.

Figure 2A:
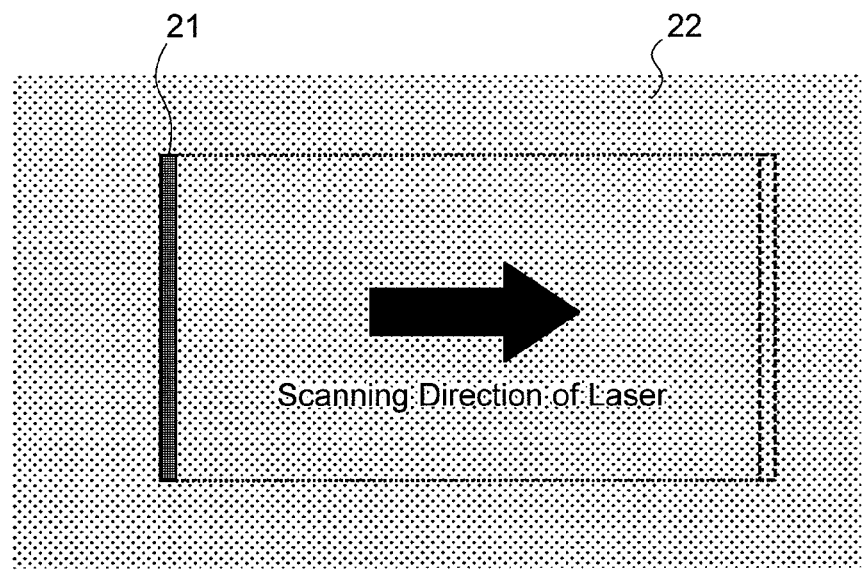
FIG. 2 is a view for explaining the source-drain direction (channel direction) of the strip-shaped crystalline silicon crystals and the thin film transistor.
Figure 2B:
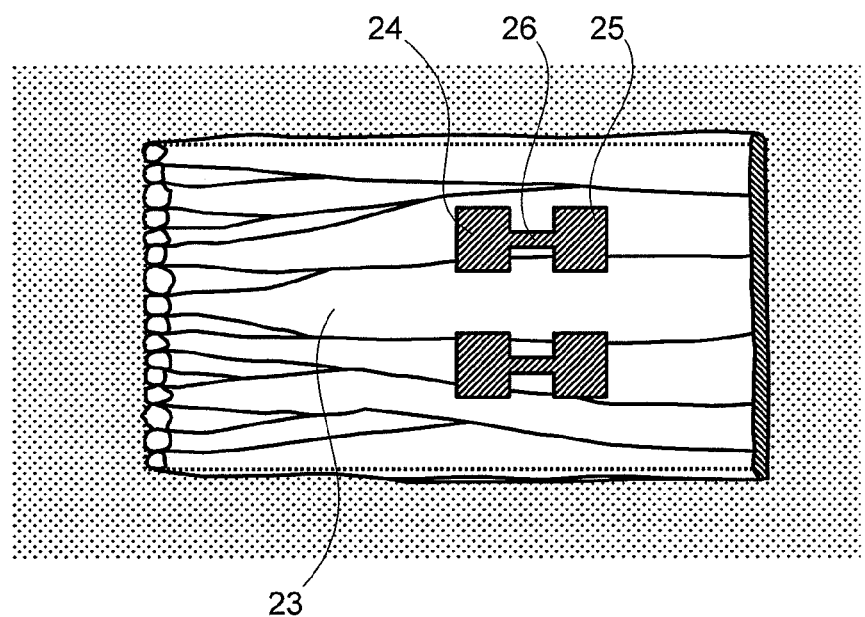

FIG. 2 is a view for explaining the source-drain directions (channel directions) of the strip-shaped crystalline silicon crystals and the thin film transistor. A laser beam 21 condensed into a linear form (that is, a rectangular form in which the width of the long axis is extremely greater than the width of the short axis) is scanned relative to the silicon thin film 22 (in this case, the starting sample may be either an amorphous thin film or a poly-crystalline thin film) formed on the substrate to conduct crystallization. This scanning direction is the direction which crosses the longitudinal direction of the linear-shaped laser beam, and is herein a direction which crosses the longitudinal direction approximately perpendicularly.

In the process that the silicon film irradiated with the linear-shaped laser beam 21 is fused and resolidified, as shown in FIG. 2(*b*), silicon crystal grains grow in the laser beam scanning direction, i.e., the lateral direction, and the crystal growth stops at a point where the laser beam irradiation is terminated. When a thin film transistor is formed by using the laterally grown silicon crystals (pseudo single crystal) 23 as an active layer, setting is made so that a channel region 26 is formed between a source region 24 and a drain region 25 in parallel to the silicon crystal grains grown in the scanning direction of the laser beam. As a result, a thin film transistor in which the crystal grain boundaries do not cross the inside of the channel 26 can be formed, and therefore a thin film transistor having a high-speed operation performance, a higher electronic mobility and a lower threshold voltage (lower Vth) variation than a conventional low-temperature polysilicon TFT can be obtained.

Figure 3A:
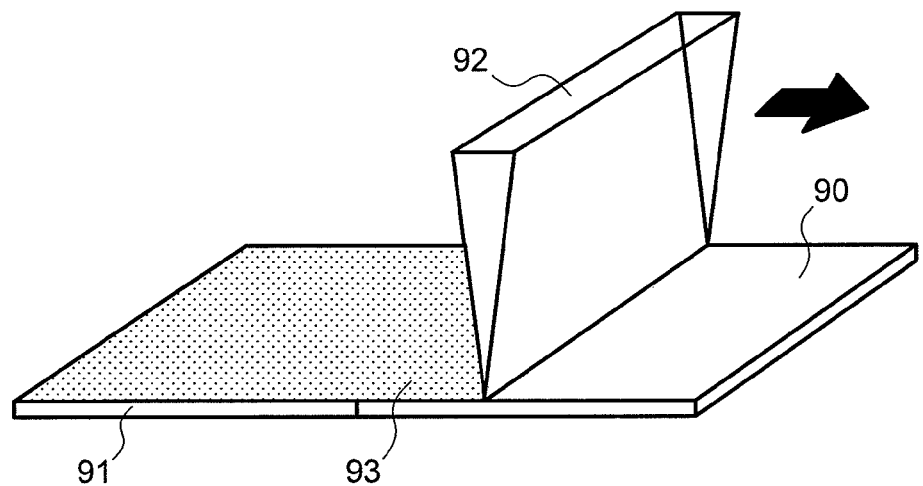
FIG. 3 is a view for explaining the outline of the SELAX manufacturing step.
Figure 3B:
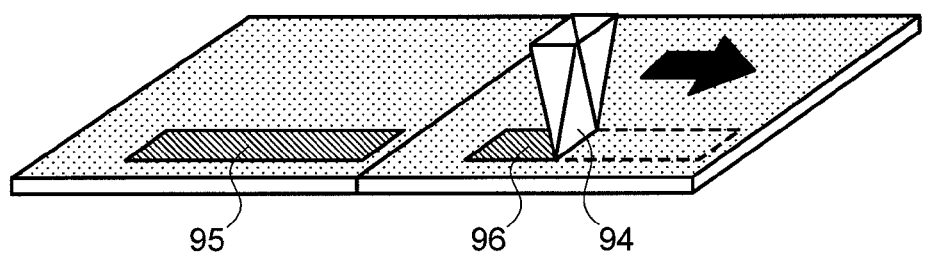
Figure 3C:
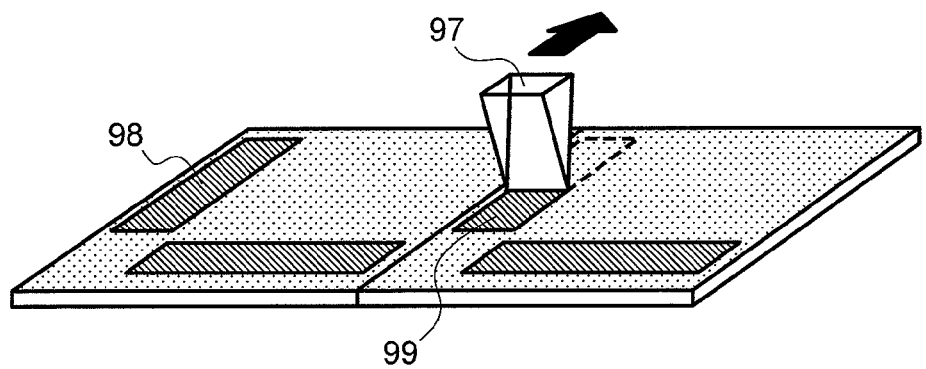

FIG. 3 is a view for explaining the outline of the SELAX manufacturing process. FIG. 3(*a*) shows two adjacent panels, i.e., thin film transistor substrates, as representative ones of a plurality of panels (generally, a large number of panels ranging from tens of panels to hundreds of panels are formed) manufactured from a large-size substrate. In this embodiment, a substrate having an amorphous silicon thin film 90 formed on one of the main surfaces of a glass substrate 91 (corresponding to the glass substrate 12 in FIG. 1) with an insulating thin film (undercoat film, not shown) interposed therebetween is used as an explanatory sample.

A display region (pixel region), a scanning line driver circuit region, signal line driver circuit region and other circuits are formed on each panel. In this embodiment, there is shown an example in which a pixel transistor whose active layer is formed from a poly-crystalline silicon film (ELA crystal) in the display region whereas a transistor capable of being driven at a high speed and having a gate formed from a pseudo single crystalline silicon film (SELAX crystal) is formed in the signal line driver circuit region and the scanning line driver circuit region and the like other than the display region. Although this embodiment shows the case where only the three regions are poly-crystallized to form the transistors, a region for providing a circuit such as a D/A converter may be formed in addition to the three regions.

As shown in FIG. 3(*a*), in the condition that a large-size substrate 91 having an amorphous silicon thin film 90 formed thereon is placed on a stage (refer to numeral 13 in FIG. 1), the amorphous silicon thin film 90 is irradiated with an excimer laser beam 92 on the whole surface of the substrate while scanned with the excimer laser beam 92 in the direction of the arrow. In this manner, the amorphous silicon thin film 90 is transformed into a poly-crystalline silicon thin film 93. Then, as shown in FIG. 3(*b*), only desired regions 95 and 96 are scanned with a linearly condensed solid-state laser beam 94 relatively in the direction of the arrow while the laser beam 94 is temporally modulated by the EO modulator. In this manner, laterally grown crystals having performance necessary for forming a signal line driver circuit are selectively formed in the desired regions 95 and 96.

Although scanning is generally performed by moving the substrate, the laser beam may be moved. After crystallization of the signal line driver circuit region on the whole surface of the substrate is completed, the substrate is rotated by 90°. Then, as shown in FIG. 3(*c*), desired regions 98 and 99 are irradiated with a linear laser beam 97 temporally modulated for forming a scanning line driver circuit. In this manner, laterally grown crystals are selectively formed in the desired regions 98 and 99. In this case, crystallization of the scanning line driver circuit region may be performed in a state that the spot of the laser beam (projected image on the substrate) is rotated by 90° instead of rotating the substrate relative to the laser beam with which it is irradiated. After the scanning is repeated until all of the signal line driver circuit regions 95 and 96 and the scanning line driver circuit regions 98 and 99 in the panels are crystallized into laterally grown crystals, irradiation is terminated.

Figure 4:
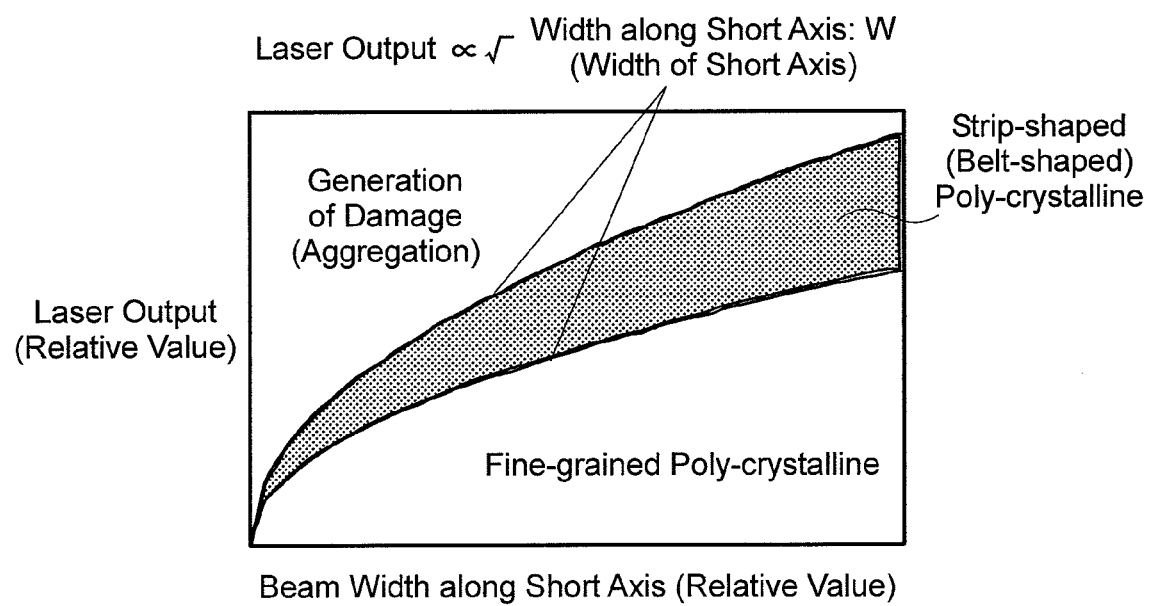
FIG. 4 is a view for showing of the correlation between the laser output, the width of the short axis of the linear-shaped beam and SELAX crystallinity in the SELAX crystallization.

FIG. 4 is a view showing the correlation between the laser output, the width of the short axis of the linear-shaped beam and the SELAX crystallinity in the SELAX crystallization. Under the condition that the scanning speed is constant, the laser output threshold values between crystallites (polysilicon) formed by an insufficient laser output and the SELAX crystals, and the SELAX crystals and the damages (aggregations) generated by excessively high laser output laser output are approximately proportionate to the square root of the width of the short axis of the beam. The damages caused by aggregation result from the phenomenon that silicon fused by irradiation of the laser beam is attracted by the surface tension and causes local aggregation, and are generated because the silicon film irradiated with the laser beam is divided into a plurality of stripe-like islands. Specifically, in a region where this silicon film has been formed, a plurality of stripe-like islands are located and spaced away from each other. Therefore, clearances where silicon does not exist as a film are formed between the stripe-like islands. Because of these clearances, a transistor itself cannot be formed on the silicon film irradiated with an excessive laser beam, and substrates (panels) on which such regions of aggregations of silicon are present are considered failures.

A common method of controlling beam which has been employed in the laser processing is a technique using peak intensity distribution. A number of techniques to evaluate the homogeneity of beam intensity distribution and use the evaluation as a scale of control in the crystallization step have been reported.

Figure 5A:
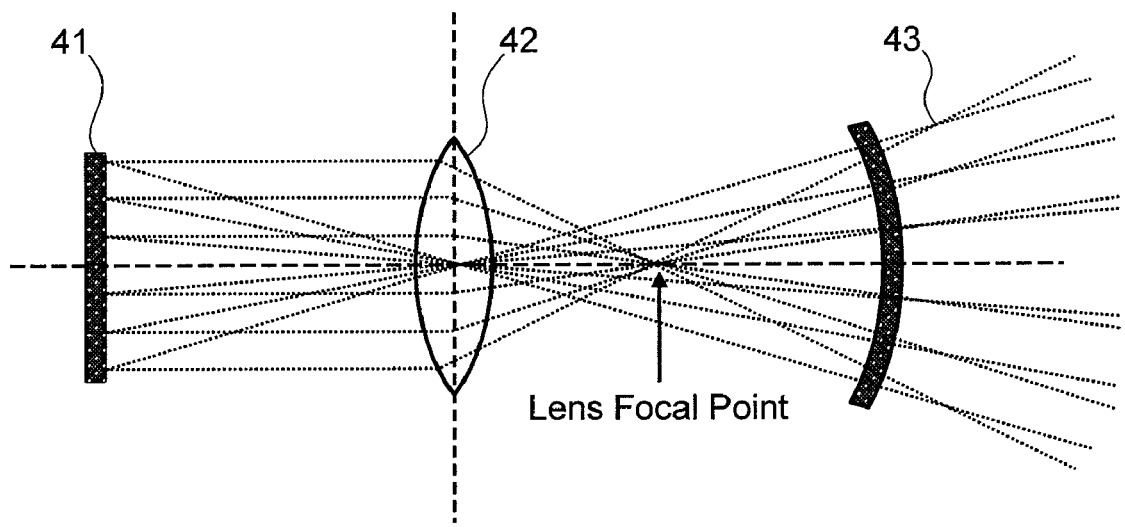
FIG. 5 is a view for explaining field curvature and distortion aberration by a shaping optical element and the shape of the laser beam on the focal plane.
Figure 5B:
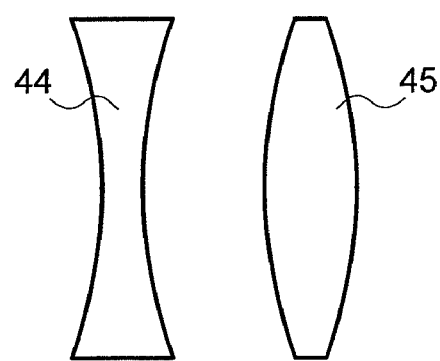

However, as shown in FIG. 5(*a*), in forming a linear-shaped beam 41 having a homogeneous intensity distribution, field curvature or distortion aberration (or distortion) is generated because of the limits in the accuracy of the shaping optical element or the processing accuracy of the spherical surface of an objective lens 42. Accordingly, the focal plane of a projected image 43 of the linear-shaped beam 41 does not coincide with the beam center at its edges, and the beam is made a thread spool-shaped beam 44 or a barrel-shaped beam 45 on a certain plane, as shown in FIG. 5(*b*). As shown in FIG. 4 mentioned above, the crystallization power threshold value varies depending on the width of the short axis. For this reason, in a curvature aberration beam, it has been impossible to control crystallization by using a peak intensity as a profile evaluation index as is conventionally done. That is, there has been the problem that the correlation between the peak intensity distribution and the SELAX crystallinity is low and whether the crystalline film is good or failure cannot be thus estimated from the beam profile.

Figure 6A:
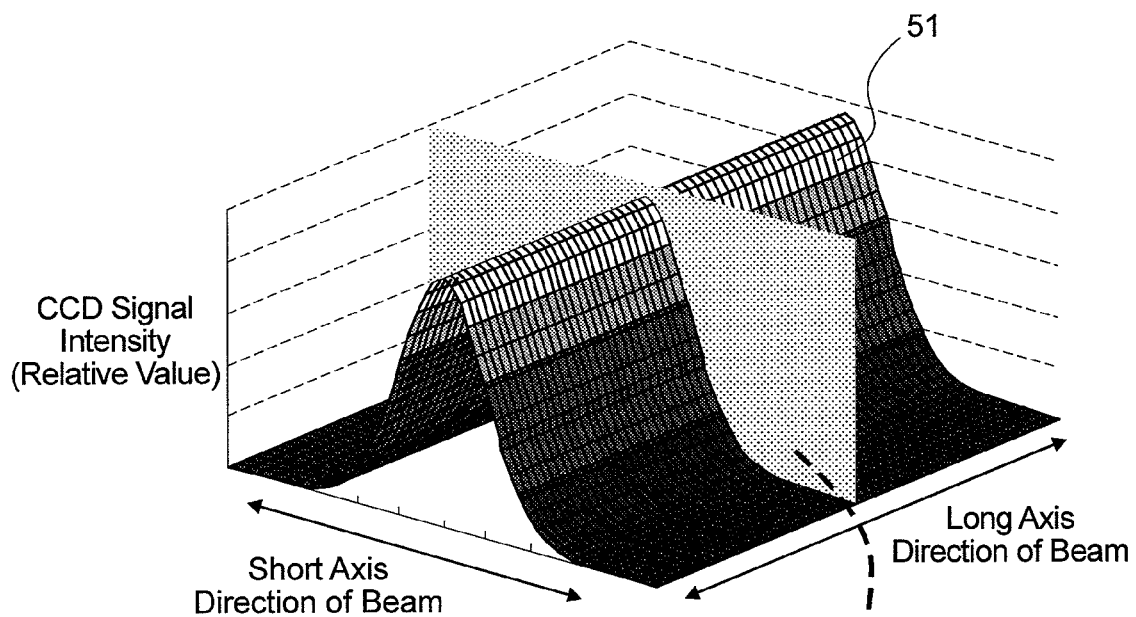
FIG. 6 is an explanatory view of the energy distribution of the entire laser beam.

Therefore, in Example 1, the beam profile is corrected by utilizing the correlation between the laser power, the width of the short axis of the beam and the SELAX crystallization condition shown in FIG. 4. A area detector type CCD camera or a linear array sensor is moved stepwise in the long axis direction of the linear-shaped laser beam or in the short axis direction to measure the energy distribution 51 of the entire laser beam as shown in FIG. 6(*a*). The number of detected signals (counter number) is accumulated in a direction parallel to the short axis of the beam to calculate the accumulated intensity E in the long axis direction of the beam. This accumulated intensity E is divided by the square root of the width W of the short axis of the beam (may be $1/e^2$ or full width at half maximum of Gaussian distribution) in each position of the long axis of the beam to calculate $E/\sqrt{(W)}$ in all the positions.

Since the laser power threshold value at which the laterally grown crystals can be obtained is proportionate to the square root of the width of the short axis of the beam, the beam profile $E/\sqrt{(W)}$ whose laser power has been corrected using the width of the short axis has a close correlation with the crystallization condition in the SELAX, and the defect determination of the crystalline film formed can be assumed from the measurement results of the beam profile.

Figure 6B:
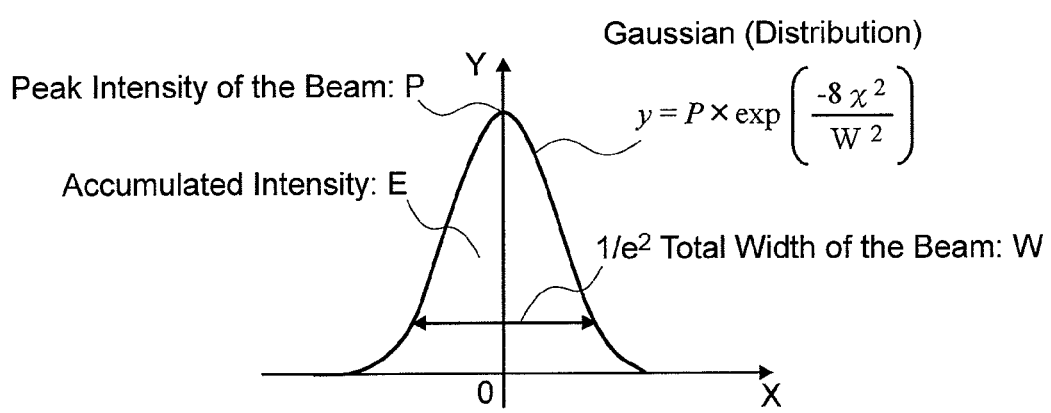

For the reason stated above, this profile is referred to as the effective beam profile. When the shape of the short axis is an ideal Gaussian distribution as shown in FIG. 6(b), the following relationship holds for the accumulated intensity E, peak intensity P, $1/e^2$ of the full width W:

$$E = \int_{-\infty}^{\infty} y\,dx = 2P \int_{0}^{\infty} \exp\left(-\frac{8x^2}{W^2}\right) dx = \frac{\sqrt{\pi}}{2\sqrt{2}} PW \quad \text{[Equation 1]}$$

Therefore, in calculating the effective beam profile, similar results can be obtained by calculating any of the parameters $E/\sqrt{(W)}$, $P > \sqrt{(W)}$ and $\sqrt{(P \times E)}$.

An intensity range with the beam profile of the laser beam suitable for the growth of the strip-shaped poly-crystalline silicon film by the SELAX method was experimentally determined. As a result, it was revealed that assuming that the lower limit value of a laser power with which the strip-shaped poly-crystals can be obtained is 1, the upper limit value of the laser power is 1.4 times higher than the lower limit value. That is, the relative ratio of the upper/lower limits of a laser power with which the strip-shaped poly-crystals can be obtained is about 40%. A silicon thin film (sample) used in this experiment is formed on a undercoat film prepared by sequentially forming an silicon oxide film and a silicon nitride film on a glass substrate, and has been subjected to the ELA (excimer laser annealing) process after the formation of the film. In other words, this silicon thin film undergoes the ELA process (excimer laser irradiation) and then laser beam irradiation by the SELAX method. The relative ratio of the powers of the laser beams projected on the silicon thin film by the SELAX method shows a similar numerical value unless the constitution of the above-mentioned undercoat film is greatly changed, although it varies more or less by the influence of the film thickness of the silicon thin film annealed by this laser beam, the film thickness of the above-mentioned undercoat film, the qualities of these films and other conditions. Considering the experiment results mentioned above, it was revealed that when determining whether the crystalline film is good or failure from the measurement results of the beam profile of the laser beam, if (maximum value Max−minimum value Min)/(mean value Ave of the intensity) of the beam profile intensity is not set to within at least 40%, a crystalline film having homogeneous performance throughout the entire laser irradiation region cannot be obtained.

EXAMPLE 2

Subsequently, with reference to FIGS. 7, 8 and 9, an example of the manufacturing method according to the present invention will be described as Example 2. A laser beam 61 shaped linearly is curved in the form of a thread spool because of lens aberration, and the width of the short axis at the center of the beam is W1, while the width has a value different from W2 at the edges of the beam. In addition, the peak intensity distribution has a flat top shape which has a constant value P along the long axis direction. Meanwhile, when the vertical axis intensity is corrected using the width of the short axis by the above technique, the profile is the product of the peak intensity P by the square root of the width W of the short axis at each position in the beam, and the profile 63 is rendered dog ear-shaped with the intensity at the center being $P \times \sqrt{(W_1)}$ and the intensity at the edges being $P \times \sqrt{(W_2)}$.

When a silicon thin film is scanned and irradiated with such a beam, since the effective intensity is different at the center and at the edges, a laterally grown crystal region 62 and a crystallite region 63 are disadvantageously formed at both edges and at the center of the laser irradiation region, respectively. FIG. 8 shows the case where a linear-shaped beam 71 is curved in the form of a barrel. Even if a peak intensity distribution 72 is adjusted to have a flat top shape with a constant value P, an effective intensity distribution 73 is caused to have an ununiform shape bulging out at the center with the intensity at the center being $P \times W_4$ and the intensity at the edges being $P \times W_3$, and there will be formed laterally grown crystals 74 in its center portion, and crystallites 75 at both edges on the actually formed crystalline film. That is, even if the peak intensity distribution is adjusted to have a flat top shape or its homogeneity is evaluated, the state of crystals cannot be presumed from the profile since it has no correlation with the SELAX crystallization condition.

Figure 9:
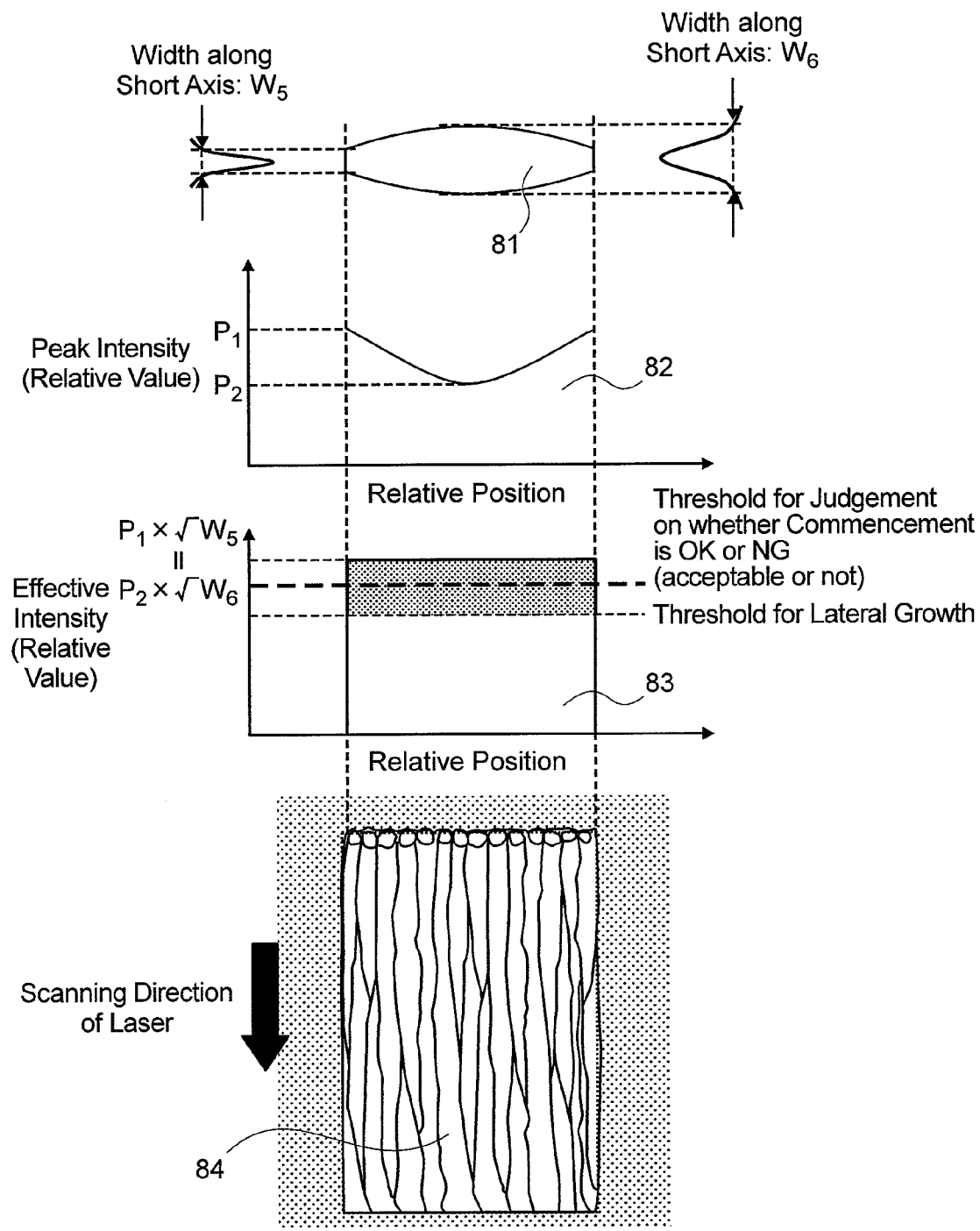
FIG. 9 is a view for explaining an example of the manufacturing method according to the present invention.

As shown in FIG. 9, the optical system is adjusted so that an effective intensity distribution 83 has a flat top shape or homogeneity is evaluated to use the result as a criterion for determining OK (Good)/NG (No Good), whereby laterally grown crystals 84 can be obtained throughout the entire irradiation region.

Figure 10:
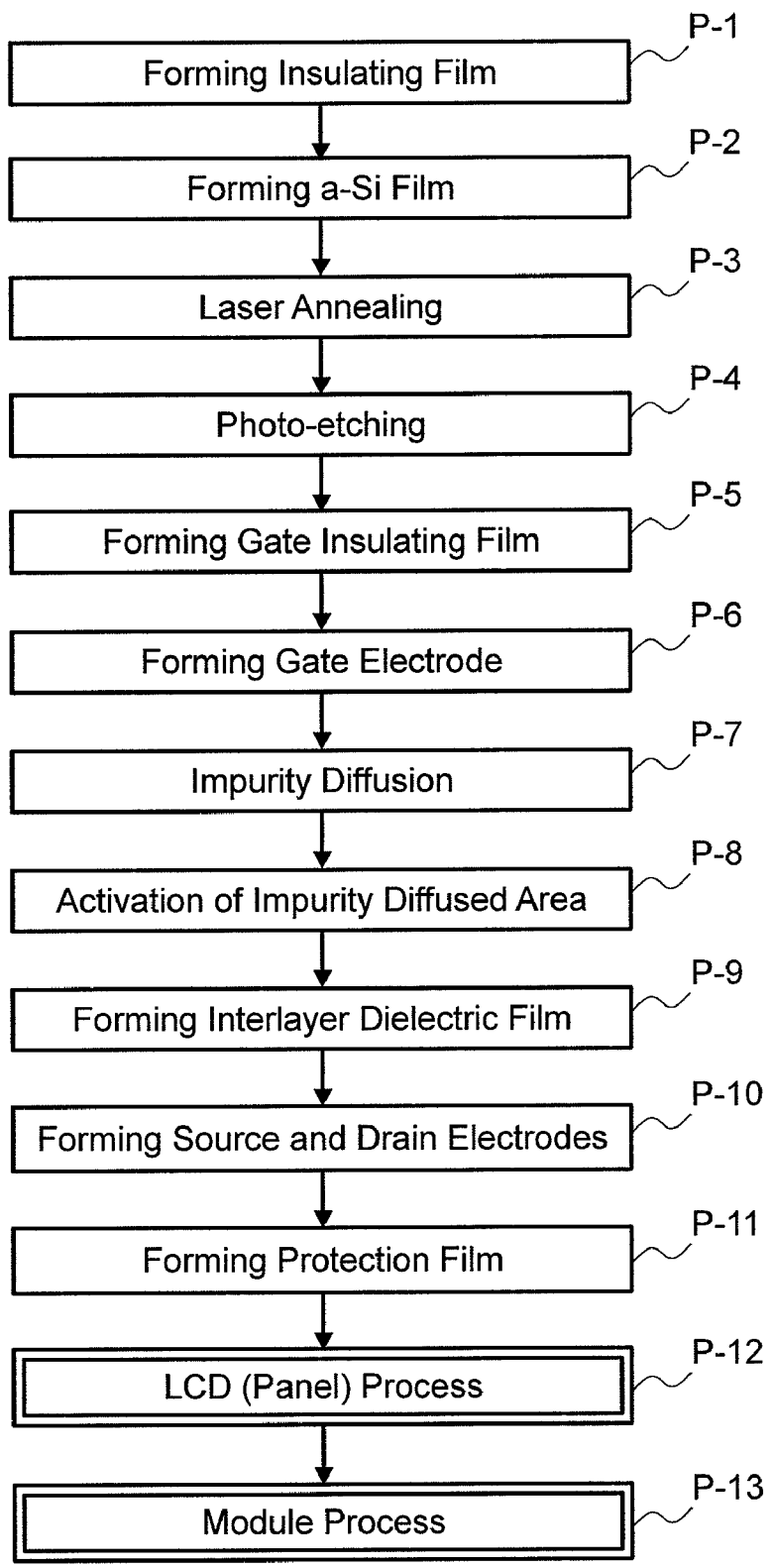
FIG. 10 is an explanatory chart of the entire process from the manufacturing of a thin film transistor substrate to the manufacturing of a liquid crystal panel.
Figure 11:
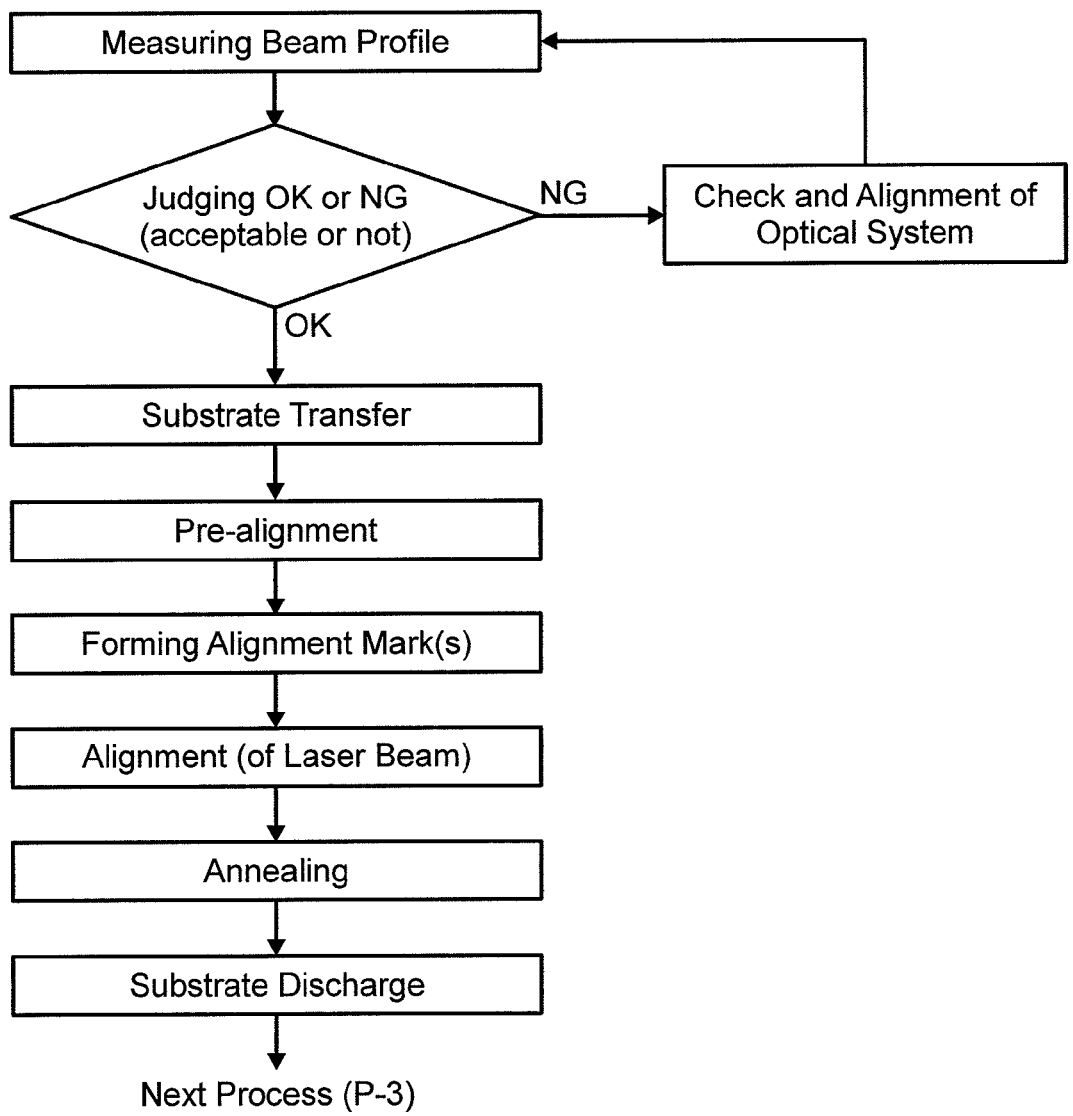
FIG. 11 is a flowchart for explaining the detailed process of the laser annealing process in FIG. 10.

Herein, the manufacturing process of the display device comprising the above annealing step is shown in FIGS. 10 and 11. FIG. 10 is an explanatory view of the whole process from manufacturing of a thin film transistor substrate to the manufacturing of a liquid crystal display panel, and FIG. 11 is a flowchart for explaining the detailed process of the laser annealing process (P-3) in FIG. 10. As shown in FIG. 10, an insulating film (silicon oxide and silicon nitride as an undercoat film) is formed on a glass substrate (process 1, hereinafter referred to as P-1); an amorphous silicon (a-Si) film is formed thereon; crystallization is carried out by ELA (P-2); and then laser annealing is carried out by SELAX (P-3). As shown in FIG. 11, in the laser annealing of this Example, before a substrate having an amorphous silicon film formed on one of its main faces or a substrate produced by converting this amorphous silicon film into a polysilicon film by the ELA process or other means is loaded onto the stage in the manufacturing device shown in FIG. 1, measurement of the beam profile of the laser beam shaped by a rectangular or linear-shaped beam spot (the long axis and the short axis are defined in its plane) and irradiated on this substrate is carried out. A go/no-go decision (hereinafter OK/NG) of the start of the annealing step of the substrate produced by the SELAX method using this laser beam is determined by the evaluation of the maximum and minimum values or evaluation of homogeneity of the intensity distribution in the long axis direction on this beam spot of the laser beam.

As shown in FIG. 9, before SELAX is started, an effective profile intensity with which a desired crystalline film can be formed sufficiently stably is determined in advance in a conditioning operation (refer to FIG. 9: a threshold value of the OK/NG determination of the start is set at a level higher than the lateral growth threshold value), and an alarm for NG of the start is set off when the lowest value of the intensity of the measured profile is lower than the determined threshold value. In case of NG, causes of undesired distribution and shape of the beam are investigated and the optical system is adjusted accordingly, and the OK/NG determination of the start is carried out by measuring the beam profile again.

When the OK/NG of the start is determined, a threshold value may be established in the effective intensity of the beam profile to carry out determination, or a threshold value may be established in the mean width of the short axis of the beam (calculated by accumulating the width of the short axis of the linear-shaped beam in the long axis direction and averaging it) to carry out determination. It is also possible to control by establishing a threshold value in homogeneity of the effective intensity and planarity (how the intensity in the long axis direction retains the same level. In general, it is calculated by ((the maximum intensity in the evaluation range−minimum intensity)/mean intensity)). The sequence for determining OK/NG of the start when determined with a threshold value established in the effective profile intensity is itemized and shown below.

[1] The beam profile of the linear-shaped beam is measured by the step scan method,

[2] the effective profile is calculated (automatic analysis by using peak intensity P, the width of the short axis of the beam $\sqrt{(W)}$),

[3] whether the effective intensity of the measured beam profile is not lower than a threshold value (of the effective intensity) determined in advance is determined,

[4] if it is lower, an alarm is set off, and the optical system including the laser oscillator is investigated. If necessary, adjustment is made so that the effective profile is reset to a desired state,

[5] After the beam is reset to the desired state, the start operation is resumed.

When the OK determination of the start is decided, the substrate is transferred to the annealing device (the manufacturing device in FIG. 1), and an alignment mark is formed after pre-alignment. The alignment mark may be formed by a laser for annealing or by another laser. It can be also carried out by means such as ink jet.

Alignment is performed with the formed alignment mark, and a pixel portion and a peripheral circuit portion are irradiated with a temporally modulated solid-state continuous-wave laser beam to cause SELAX crystallization. When required annealing is terminated, the substrate is carried out of the laser annealing device, and sent to the following step.

Figure 7:
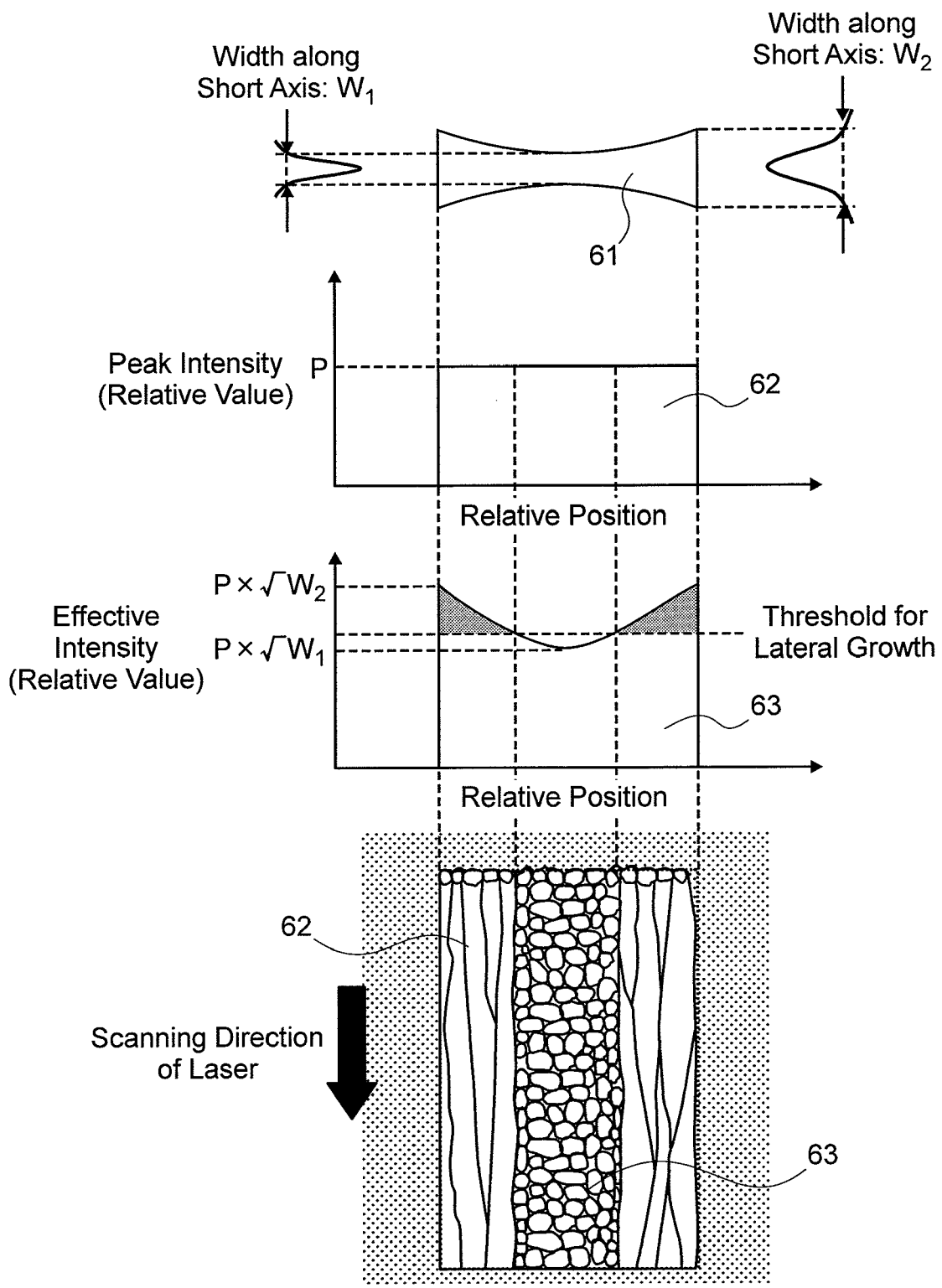
FIG. 7 is a view for explaining an example of the manufacturing method according to the present invention.
Figure 8:
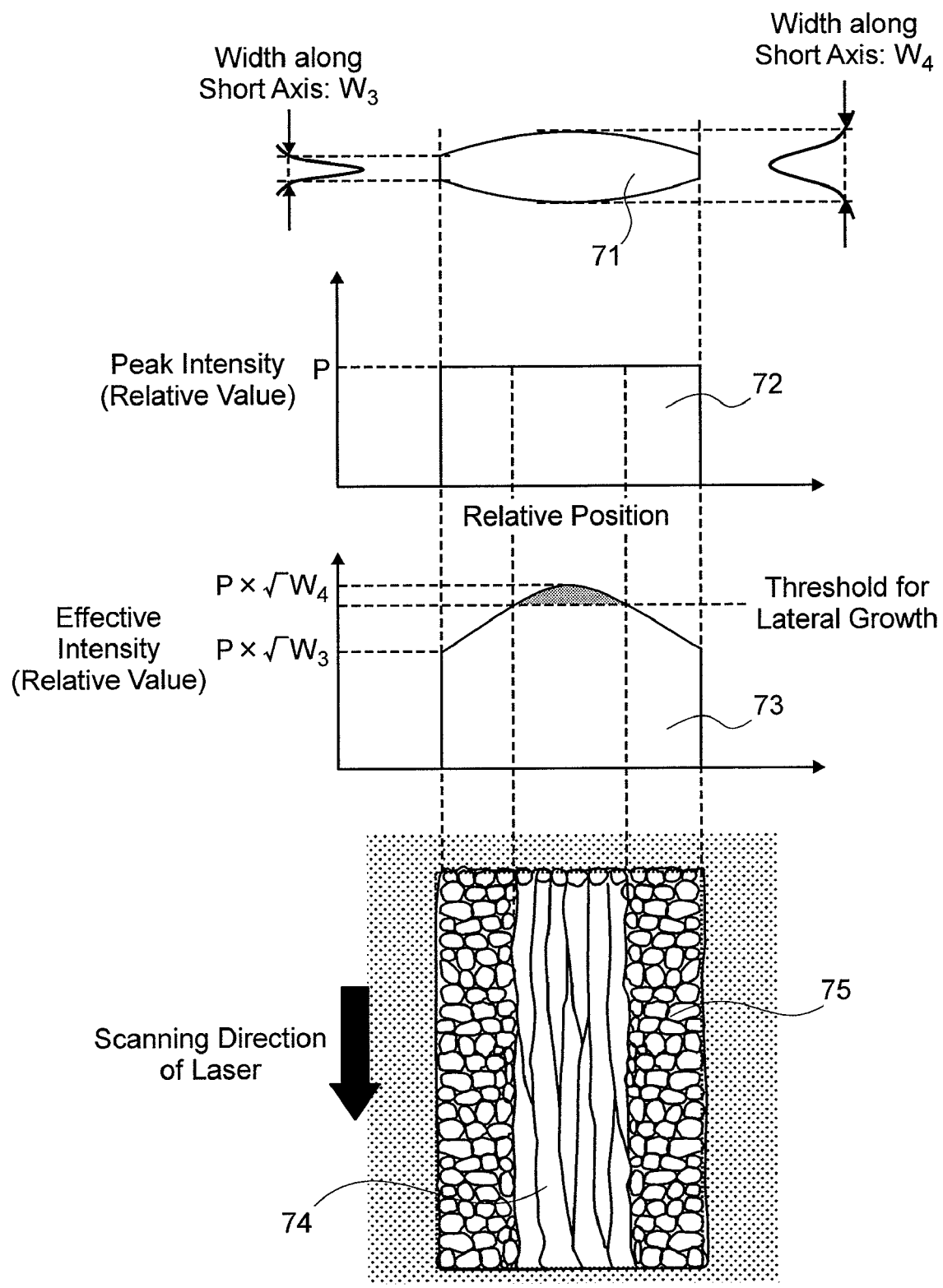
FIG. 8 is a view for explaining an example of the manufacturing method according to the present invention.

As described in FIGS. 7 and 8, a silicon film in which the crystallite (polysilicon) film and the SELAX crystalline (lateral crystalline silicon) film coexist in its laser irradiation region can be formed with good positioning accuracy.

Thereafter, a silicon film portion which will be the active layer of the thin film transistor is left intact by patterning in the shape of islands (P-4), and a gate insulating film is formed (P-5). A gate electrode is then formed (P-6). At this time, a scanning signal line connected to the gate electrode is simultaneously formed. Impurities are implanted in the silicon film by the ion implantation using this gate electrode as a mask. The impurities are diffused (P-7), and are activated (P-8).

An interlayer dielectric film is formed in a manner of covering the gate electrode (P-9), and source and drain electrodes are subjected to patterning (P-10). At this time, a drive signal line connected the source electrode or drain electrode is simultaneously formed. A protective film (passivation film) is formed in a manner of covering the source and drain electrodes (P-11). A contact hole which leads to the drain electrode or source electrode is formed in the protective film, and a pixel electrode is formed in a manner of being connected to the drain electrode or source electrode through the contact hole. A thin film transistor substrate is completed by the procedure described above.

The substrate is stuck together with another substrate which is separately produced (normally, a color filter substrate). Liquid crystal is poured into the clearance between the two stuck substrates and sealed, producing a liquid crystal panel (P-12). A liquid crystal module is produced by integrating a backlight, display control, color substrate and others along with this liquid crystal panel (P-13).

The thin film transistor substrate produced in the present invention is not limitedly applied to the above-mentioned liquid crystal panel, but can be similarly applied to substrates for organic EL panels and other active matrix display devices.

It should be noted that the above-mentioned evaluation method can be also applied to quantitative evaluation of beam profile of a linear-shaped beam with a high aspect ratio of a maskless laser writing system.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A manufacturing method of a display device for obtaining an active matrix substrate for the display device by scanning and irradiating a plurality of regions in an amorphous semiconductor film or a granular poly-crystalline semiconductor film on an insulating substrate with a laser beam shaped linearly in a scanning direction which crosses a long axis direction of said laser beam to carry out annealing to reform said amorphous semiconductor film or said granular poly-crystalline semiconductor film into a strip-shaped poly-crystalline semiconductor film on the insulating substrate extending in said scanning direction, the method comprising:

moving an area detector type CCD camera or a linear array sensor stepwise in said long axis direction or a short axis direction of said laser beam to thereby detect an energy distribution of said laser beam;

accumulating detected signals of said energy distribution in a direction parallel to said short axis direction of said laser beam;

calculating an accumulated intensity in said long axis direction of said laser beam;

dividing a calculated intensity by a square root of a width of said short axis direction of said laser beam in each position of said laser beam along said long axis direction to thereby obtain an intensity distribution; and feeding a maximum value and a minimum value of said intensity distribution in a region which controls a profile of said laser beam back to an oscillation source of said laser beam or an optical system of the display device to thereby control the profile of said laser beam.

2. A manufacturing method of a display device according to claim 1, wherein, when the accumulated intensity in said long axis direction of said laser beam is E and the width of said short axis direction of said laser beam is W, said intensity distribution is calculated by $E/\sqrt{(W)}$.

3. A manufacturing method of a display device according to claim 2, wherein the width W of said short axis direction of said laser beam is $1/e^2$ of Gaussian distribution.

4. A manufacturing method of a display device according to claim 2, wherein the width W of said short axis direction of said laser beam is a half-width of Gaussian distribution.

5. A manufacturing method of a display device for obtaining an active matrix substrate for the display device by scanning and irradiating a plurality of regions in an amorphous semiconductor film or a granular poly-crystalline semiconductor film on an insulating substrate with a laser beam shaped linearly in a scanning direction which crosses a long axis direction of said laser beam to carry out annealing to reform said amorphous semiconductor film or said granular poly-crystalline semiconductor film into a strip-shaped poly-crystalline semiconductor film on the insulating substrate extending in said scanning direction, the method comprising:

a process of moving an area detector type CCD camera or a linear array sensor stepwise in said long axis direction or a short axis direction of said laser beam to thereby detect an energy distribution of said laser beam; and a process of:
accumulating detected signals of said energy distribution in a direction parallel to said short axis direction of said laser beam,
calculating an accumulated intensity in said long axis direction of said laser beam,
dividing a calculated intensity by a square root of a width of said short axis direction of said laser beam to thereby obtain an intensity distribution, and
calculating a maximum value, a minimum value and a means value of said intensity distribution in a region which controls a profile of said laser beam, and feeding a value "(maximum value+minimum value)/mean value" back to an oscillation source of said laser beam or an optical system of the display device to thereby control the profile of said laser beam.

6. A manufacturing method of a display device according to claim 5, wherein, when the accumulated intensity in said long axis direction of said laser beam is E and the width of said short axis direction of said laser beam is W, said intensity distribution is calculated by $E/\sqrt{W}$.

7. A manufacturing method of a display device according to claim 6, wherein the width W of said short axis direction of said laser beam is $1/e2$ of Gaussian distribution.

8. A manufacturing method of a display device according to claim 6, wherein the width W of said short axis direction of said laser beam is a half-width of Gaussian distribution.

9. A manufacturing method of a display device according to claim 5, wherein said value "(maximum value+minimum value)/mean value" of the intensity distribution of said laser beam in the region which controls the profile of said laser beam is lower than 40%.

10. A manufacturing method of a display device for obtaining an active matrix substrate for a display device by scanning and irradiating a plurality of regions in an amorphous semiconductor film or a granular poly-crystalline semiconductor film on an insulating substrate with a laser beam shaped linearly in the direction which crosses the long axis direction to carry out annealing to reform said amorphous semiconductor film or said granular poly-crystalline semiconductor film into a strip-shaped poly-crystalline semiconductor film extending in said scanning direction, wherein the method is characterized by comprising:

feeding the square root of a peak intensity distribution P in each position in said laser beam×an accumulated intensity distribution E, $\sqrt{(P \times E)}$, $P \times \sqrt{W}$ back to an oscillation source of said laser beam or an optical system of the device to thereby control the profile of the laser beam.

11. A manufacturing method of a display device according to claim 10, wherein said value "(maximum value+minimum value)/mean value" of the intensity distribution of said laser beam in a region which controls the profile of said laser beam is lower than 40%.

* * * * *